(12) United States Patent
Purser et al.

(10) Patent No.: US 7,365,340 B2
(45) Date of Patent: Apr. 29, 2008

(54) RESONANCE METHOD FOR PRODUCTION OF INTENSE LOW-IMPURITY ION BEAMS OF ATOMS AND MOLECULES

(75) Inventors: Kenneth H. Purser, Lexington, MA (US); Albert E. Litherland, Toronto (CA); Norman L. Turner, Vero Beach, FL (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 301 days.

(21) Appl. No.: 11/185,141

(22) Filed: Jul. 20, 2005

(65) Prior Publication Data

US 2007/0018114 A1 Jan. 25, 2007

(51) Int. Cl.
  *H01J 7/24* (2006.01)
(52) U.S. Cl. .............. 250/424; 250/425; 250/423 R
(58) Field of Classification Search ........... 315/111.81, 315/39; 250/492.21, 423 R, 425, 424
See application file for complete search history.

(56) References Cited

U.S. PATENT DOCUMENTS

| | | | |
|---|---|---|---|
| 3,395,302 A | * | 7/1968 | Brown, Jr. et al. ..... 250/423 R |
| 4,037,100 A | | 7/1977 | Purser |
| 4,486,665 A | * | 12/1984 | Leung et al. ............... 250/427 |
| 6,452,338 B1 | | 9/2002 | Horsky |
| 6,573,510 B1 | | 6/2003 | Vella |
| 6,686,595 B2 | * | 2/2004 | Horsky ....................... 250/427 |
| 2002/0003208 A1 | | 1/2002 | Dudnikov |
| 2004/0119025 A1 | | 6/2004 | Klepper et al. |
| 2005/0051096 A1 | * | 3/2005 | Horsky et al. ........ 118/723 CB |

* cited by examiner

*Primary Examiner*—Nikita Wells
*Assistant Examiner*—Johnnie L Smith, II
(74) *Attorney, Agent, or Firm*—Nields & Lemack

(57) ABSTRACT

The present invention comprehends a compact and economical apparatus for producing high intensities of a wide variety of wanted positive and negative molecular and atomic ion beams that have been previously impossible to previously produce at useful intensities. In addition, the invention provides a substantial rejection of companion background ions that are frequently simultaneously emitted with the wanted ions. The principle underlying the present invention is resonance ionization-transfer where energy differences between resonant and non-resonant processes are exploited to enhance or attenuate particular charge-changing processes. This new source technique is relevant to the fields of Accelerator Mass Spectroscopy; Molecular Ion Implantation; Generation of Directed Neutral Beams; and Production of Electrons required for Ion Beam Neutralization within magnetic fields. An example having commercial importance is ionization of the decaborane molecule, $B_{10}H_{14}$ where an almost perfect ionization resonance match occurs between decaborane molecules and arsenic atoms.

31 Claims, 2 Drawing Sheets

RESONANCE METHOD FOR PRODUCTION OF INTENSE LOW-IMPURITY ION BEAMS OF ATOMS AND MOLECULES

This applications claims the benefit of domestic priority based on U.S. Provisional Application Ser. No. 60/683,016, entitled "A Resonance Method for Producing Intense beams of Molecular Ions", filed May 20, 2005; the disclosure of which is hereby incorporated by reference.

FIELD OF THE INVENTION

Accelerator mass spectroscopy, isotope dating, high-energy semiconductor implantation, low-energy semiconductor ion implantation, molecular beam implantation, cluster beam ionization, decaborane ionization, isobaric particle rejection.

BACKGROUND OF THE INVENTION

The technique to be described has important applications in several fields of scientific research and in industry. These include molecular ion implantation; the generation of directed neutral beams; the production within magnetic fields of low-energy electrons required for ion beam neutralization; the attenuation of unwanted isobars during accelerator mass spectroscopy (AMS) measurements. Such processes will be briefly described below:

Molecular Ion Implantation in the Semiconductor Industry

The formation of ultra-shallow junctions requires ions beams having energies between a few hundred electron volts and 3 keV. While commercial viability demands high beam currents to achieve useful production throughputs, the difficulties of extracting and transporting beams of such low-energy ions are substantial. The fundamental problem is the introduction and maintenance of an adequate number of space-charge neutralizing electrons or negative ions within the ion beam to avoid beam 'blow-up'. The classic neutralizing method, well known since World War Two and the Manhattan Project, involves generation of electrons that are produced by the ionization of molecules within the space-charge well of the ion beam by impacts of beam particles with residual gas molecules. Unfortunately, this process becomes ineffective at low particle velocities and other techniques must be used.

An important suggestion to avoid this problem was made in 1993 by Yamada et al., and reported in the journal *Nuclear Instruments and Methods*, volume 79, page 223. Yamada's suggestion was that if singly-charged molecular clusters of the wanted ions were substituted for individual atoms of the wanted atomic species the problems of low-energy implantation would be substantially alleviated. One such molecular substitution described by Jacobson et al. in the *IEEE Conference Report "IIT 2000"* used ionized molecular decaborane ($B_{10}H_{14}^+$) that was extracted from a suitable ion source and accelerating to a kinetic energy approximately eleven times greater than would be used were the implantation ion beam composed solely of individual $B^+$ atoms. As an example, during implantation of 500 eV boron atoms the parent decaborane ion would be accelerated to an energy of 5.5 keV; an energy that allows the molecular ions to be readily transported through a modern implanter. Clearly, the measured implantation dose, using charge collection, is magnified ten-fold, compared to that using conventional boron implantation, causing space-charge forces to be correspondingly reduced.

To confirm the usefulness of this process for semiconductor fabrication, several workers have demonstrated decaborane implantation for actual device construction. One example, reported by A. Perel on page 304 of the *IEEE Conference Report "IIT 2000"* made secondary ion mass spectrometry (SIMS) measurements to establish depth distributions of boron atoms following cluster implantation into silicon. Perel's data showed no clear differentiation between the depth distributions of conventionally implanted boron atoms and molecular $B_{10}H_{14}^+$ implants of the same velocity.

Methods and apparatus using electron beams for ionizing decaborane without substantial dissociation of the decaborane molecular structure have been described by Horsky in U.S. Pat. Nos. 6,452,338 and 6,686,595. In addition, Vella describes in U.S. Pat. No. 6,573,510 B1 a method and apparatus for a double-chamber charge-exchange source that can produce singly-charged decaborane ions.

In the present disclosure an alternative highly-efficient ionization process is described for production of singly-charged molecular decaborane ions. The process employs the well-known phenomenon of resonant charge exchange between molecular or atomic ions where an incoming primary ion beam is directed through a region containing cluster molecules or atoms that are to be ionized and accelerated. While an immediate application is the production of high currents of singly-charged decaborane ions, applications involving other atom and molecular species are also expected to become of importance as requirements grow for other beams needed for low-energy implantation.

The features that make this procedure more attractive than the apparatus described above by Horsky and Vella include: (1) Higher currents of charged decaborane should become available using the resonance procedure; (2) Smaller backgrounds of unwanted masses should be produced because of the selective resonance nature of the interaction.

Accelerator Mass Spectroscopy (AMS)

AMS has been described in detail by a number of authors who have presented methods by which AMS techniques can be applied to the detection of rare stable and radioactive isotopes, such as $^{10}Be$, $^{14}C$, $^{26}Al$, $^{36}Cl$, and $^{129}I$. Such descriptions include U.S. Pat. No. 4,037,100 to Purser; an article by Purser, K. H., Litherland, A. E. and Gove, H. E. in the journal *Nuclear Instruments and Methods* volume 162, page 637, (1979) entitled "Ultra-sensitive particle identification systems based upon electrostatic accelerators". These publications point out that using AMS it is routine for the ratio of the detection limits of many rare radioactive nuclei to be between $10^{-14}$ and $10^{-16}$ compared to the concentration of the elemental stable isotopes. These ratios indicate more than six orders of magnitude greater sensitivity than is possible using conventional mass spectroscopy.

A central problem for detecting radioactive atoms at such low abundance is that high beam currents of the parent element are essential. For example, for single atom detection of radioactive atom concentrations below $10^{-16}$ (compared to the number of atoms of the parent element) milliampere beams of the parent element are desirable. In addition, such beams should be as pure as possible with low levels of molecular and isobaric contaminants.

For the purposes of AMS measurements the present invention can exploit the differences between resonant and non-resonant processes allowing enhancement or attenuation of a particular elemental species. For example, a beam of $Cs^-$ ions traversing a cell containing cesium atoms would transfer charge to the Cs atoms much more efficiently than to non-identical atoms. Thus, it is possible extract the stationary negative cesium ions that are formed within the cell at the expense of other non-identical atoms that may be present.

Currently, most AMS instruments use a sputter source for production of negative ions; such sources have been described by R. Middleton, "A Negative Ion Cesium Sputter Ion Source" reported in *Nuclear Instruments and Methods*. Volume 214, page 214, (1983). Generally, the yield of negative ions from these sources decreases rapidly with the mass of the negative ion and also falls with reducing electron affinity. Following the results presented by Norskov J. K. et al "Secondary Ion Emission in Sputtering", in *Physical Review B*, volume 19, page 5661, (1979) the ratio, $\varepsilon$, of negative ions produced relative to the sputtered neutral atoms is given by $$\varepsilon \partial \propto e-\beta(\phi-A)\sqrt{M} \qquad (1)$$

where $\beta$ is a constant related to that of said Norskov and Lundquivst.

$\phi$ is the work function of the sputtered surface.

A is the electron affinity of the sputtered species.

M is the mass of the sputtered species.

It can be seen from equation 1 that for heavy ions the yields of negative ions from a sputter source tend to be dramatically lower than the yields for carbon—a light atom with a large electron affinity. As a consequence, while negative ions are quite ubiquitous, for those species where the electron affinity is small, the ion production rate from a sputter source may be so low that the beam is useless for many measurements.

Using the present near-resonant transfer invention, the above sputtering impediment is no longer a limitation to the formation of beams of weakly-bound negative ions. In addition, precisely equal electron affinities of the two partners are not essential for efficient charge transfer, as will be discussed later.

Neutral Beam Technology

A class of implants that have become important involves the ions having energies close to a million electron Volts. One reason for this growth of high-energy implantation has been transistor miniaturization. Over time, individual transistors have become smaller and closer together and also operate at much lower voltages. These changes have led to increases in electrical capacitance between elements that may cause parasitic current-coupling between individual circuits that can cause circuit instabilities. To avoid these undesirable effects it is often useful to introduce barriers that electrically isolate the transistor circuits one from another and from the underlying substrate through which parasitic currents might flow. Such substrate isolation can be produced by implanting a low-resistivity layer below the active circuit. Generally, the energies needed for such a process are in the range 0.8 to 3.0 MeV and require the use of acceleration voltages that are high compared to those employed during conventional implantation or alternatively the installation of complicated radio-frequency radio frequency accelerators.

One class of commercial high-energy implanters uses d.c. voltages and the tandem acceleration principle for the production of ions having energies in the million electron-volt range. During this process, negative ions are accelerated from ground to a positive terminal where the charge of the incoming negatively charged ion are converted to positive polarity by stripping electrons from the negative ions. A following stage of acceleration returns these positive ions to ground potential.

Unfortunately, the cross section for the necessary negative ion production tends to be small and it is this limitation of the tandem-type acceleration system that often restricts beam-current intensity. One method of avoiding this problem is to employ a neutral beam of the wanted ions that is drifted without acceleration through the first stage of a million-volt dc tandem configuration. The neutral beam delivers neutral particles to a high voltage terminal where they are charge changed to positive polarity by removing one or more electrons as the ions pass through a suitable gas cell or foil. Effectively, this process creates positive ions within a positive polarity terminal from whence they are accelerated back to ground potential, gaining energy on the way. The importance of such a scheme is that beam intensities of ions having ~MeV energies can be substantially increased—often by as much as an order of magnitude.

Studies of the neutralization of $^{11}$B beams for the production of such neutral beams have been made by I. Tomski and reported in an MSc thesis he submitted in 1997 to the University of Toronto. The feature of this work was that molecules were used for neutralization of a fast beam of directed boron ions. These ions were passed through a cell filled with a low-pressure vapor of the organic molecule anisole ($C_7H_8O$). The usefulness of anisole is that the ionization potential for boron is 8.29 eV and anisole provides an almost perfect resonance-ionization match to boron. Cross sections were measured for three materials, water (ionization potential 12.612 eV), methonal (10.85 eV) and anisole (8.21 eV). The measured cross sections for $B^+$ to $B^\circ$ at 10 keV, in units of $10^{-15}$ cm$^2$, were Water—2.1+/−0.2; Methonal—.2.7+/−0.2; Anisole—.5.9+/−0.6 indicating a near-resonant effect.

Background Underlying Resonant Interactions

Although limitations in scope are not intended, a charge-transfer reaction between positive atoms or positive molecules and neutral atoms or neutral molecules can be written:

$$Y^\circ + X^+ \rightarrow Y^+ + X^\circ \qquad (1)$$

During such reactions an electron that was initially part of the neutral target atom, $Y^\circ$, is transferred to the moving charged projectile, $X^+$, causing the original charged $X^+$ to become electrically neutral and the original stationary atom, $Y^\circ$, positively charged, $Y^+$. Here, both X and Y particles can be either atoms or molecules. The convention used is that $X^+$ refers to the incoming projectile atom or molecule initiating the reaction and $Y^\circ$ is the target atom or molecule. However, it should be kept in mind that during the production of fast neutral beams the incoming positive ions, $X^+$, can also be converted to neutral charge allowing previously focused directed fast ions to be converted into directed neutral-particle beams. Also, the same type of resonant interaction can be used for producing resonant charge exchange between negative ions and neutral particles.

The dominant controlling parameter for estimating cross sections for such interactions is the energy difference, $\Delta E$, between the ionization potential or electron affinity of the neutral target atom, $Y^\circ$, and those of the uncharged projectile atom, $X^\circ$. When $\Delta E$ is small, the cross section for the reaction described by equation 1 can be large leading to high probability for resonant charge transfer.

The physical basis for this effect is that when atoms or molecules pass each other the wave functions of both particles become coupled inducing an electron oscillation between the particles. The cross section for this process becomes large when the difference in electron binding energies between the two particles is small and when the relative velocity is low. These are the prerequisite for resonant or near-resonant electron transfer. In contrast, for those cases where the electron binding energies for each of the two particles are substantially distinct, resonance conditions will no longer be dominant and the electron transfer cross sections smaller.

Those skilled in the art will recognize that the above two-atom system is the atomic analog of a pair of weakly coupled oscillators tuned to the same frequency. For the case of two weakly-coupled identical pendulums, it is well known that oscillatory motion is transferred from the first to the second. When all of the energy of the first has been transferred to the second the process reverses and energy transfers back to the first pendulum. In this manner energy is transferred back and forth between the two components, ad infinitum. For atomic systems an electron oscillates between the two atoms or molecules, X and Y, with the 'flipping' frequency for electron transfer becoming large if $\Delta E$ is small. When the pair finally separates the electron becomes trapped on one or other component leading to a yield of about 50% of the incoming charged-particle intensity being transferred to the other partner. Ion sources designed to take advantage of this effect make available a new realm for production of both positive and negative ion beams.

Detailed theories for describing such resonant charge transfer processes have been presented by H. S. W. Massey, and H. B. Gilbody in the book "Electronic and Ionic Impact Phenomena", Oxford University Press volume 4, page 2579, (1974); also by Sakabe, S., and Yazukazu, I., "Cross Sections for Resonant Transfer between Atoms and their Positive Ions", *Atomic and Nuclear Data Tables* volume 49, page 257-314 (1991). In those cases where the base atoms are identical or, when the particles are dissimilar and the electron binding energies are substantially the same, the probability of resonant charge transfer is substantial, even for large values of the impact parameter. A useful and corrected estimate of the variation of the cross section for near-resonant electron transfer has been published by Litherland et al. in a paper entitled 'Ion reactions for isobar separation in accelerator mass spectrometry' and published in the journal *Nuclear Instruments and Methods B* volume 204, pages 323-327, (2003).

In addition, it should be noted from the above Litherland reference that precisely equal ionization potentials of the two partners is not essential for efficient charge transfer. One can predict approximately the magnitude of cross sections for resonance ionization from the Uncertainty Principle which shows that the cross sections will be high if the product $\Delta E \times \Delta t$ is of order $h/2\pi$. Here, $\Delta t$ is of order $D/v$ where v is the velocity of the fast ion and D is the "size" of the molecule. For example if D is 1 nanometer and E, the translation energy, is 10 keV for an incoming As+ ion then $\Delta E$ will be of magnitude 107 meV. However, those skilled in the art will recognize that D is not well defined and that resonant cross sections will not change abruptly but will fall smoothly as the differential ionization energy increases. Useful resonant ionization is still expected when $\Delta E$ is several times greater than the above estimated magnitude.

While the mechanism of formation was not been clarified until recently, there is a known example in the lore of negative heavy ion generation used for nuclear studies that illustrates the above charge transfer mechanism between non-identical negative atomic ions. This measurement made when a beam of He$^-$ ions were passed through a vapor of neutral calcium atoms in a geometry which allowed any Ca$^-$ ion that had been generated to be extracted as an independent ion beam showed that the measured intensity of the Ca$^-$ beam (~1 microampere) was startlingly high. Ultimately, the result was deemed a curiosity. Details were reported by K. H. Purser in an article entitled "Developments made at the Rochester Tandem Laboratory" within the *Proceedings of the SNEAP Conference*, Tallahassee Fla., page 6, (1972), edited by K. Chapman and issued by Florida State University. As the goal of the experiment was production of high-energy Ca$^-$ ions for nuclear physics measurements and an ion current of one microampere was more than adequate, no efforts were made to increase the output current above this value. However, recently, the reason for the high production rate became clear when it is was recognized that the electron affinity of He$^-$ is ~0.078 eV and the electron affinity of Ca is now known to be ~0.022 eV; resonance charge exchange between the primary He$^-$ ions and the neutral Ca atoms in the vapor enhances the cross section for Ca$^-$ production.

Although limitations in scope are not intended, an important example of the usefulness of such resonance processes is the ionization of decaborane by a slow beam of arsenic atoms. As mentioned above the key to efficient transfer is that the ionization potential of decaborane must be close to that of the exciting beam. Experimentally, the ionization potential of $B_{10}H_{14}$ has been accurately measured to be 9.88+/−0.03 eV. The closest atomic particle that matches this ionization potential is arsenic, As, which has an almost identical ionization potential—9.815 eV. In addition, the first excited state of As is at 131.9 meV (milli electron Volts) or only 30 meV away from resonance with the measured ionization potential of the decaborane molecule. The difference in ionization potential between the two ground states, $\Delta E$, is only ~80 meV so a strong resonance can be expected at the lowest energies. For incoming As+ ions having energy of 10 keV the calculated cross section for interactions with decaborane is $2.77 \times 10^{-15}$ cm$^2$; for As$^+$ ions having energy of 1 keV the resonance effect is even more pronounced with the calculated exchange cross sections being—$3.94 \times 10^{-15}$ cm$^2$—a substantial area on an atomic scale.

An important feature of such resonance ionization processes is that, because the natural quantum mechanical frequency is well-defined and narrow, such reactions are selective and it is anticipated that there will be few dissociation background products from other decaborane configurations; the expectation is that most of the disintegration particles will be hydrogen. Notwithstanding, those skilled in the art will recognize that the energetic incoming arsenic ions will occasionally make a head-on collision with a decaborane molecule shattering it to produce a background of particles that will have to be eliminated from the charged decaborane beam using a low-resolution magnetic deflection or crossed-field velocity filtering.

Practical aspects which make the above process so attractive for generating singly charged decaborane are: First, there is a close ionization-energy match between As and decaborane; secondly, 20-30 mA currents of As$^+$ can be readily generated in a well-formed ion beam. The wanted energy for boron implantation can be adjusted by arranging that the decaborane ions are accelerated to whatever energy is needed for implantation by elevating the decaborane source chamber to a potential ~11 times higher than the wanted final implantation energy. As an example, for the production of boron implantation using atoms having implantation energy of 3 keV, the decaborane source would be elevated to a potential of ~33 keV. In practice, the incoming As+ ions would enter the decaborane cell with energy close to 1 keV or whatever energy is judged to be most appropriate for maximizing the charge-exchange resonance; however, it is not anticipated that this energy will be a critical parameter.

Clearly, to take advantage of resonance effects and produce all ions at high intensity a variety of primary beams are needed having a range of electron affinities. Those skilled in the art will recognize that many experiments have been conducted using the rare gas atoms, such as helium, neon, argon, krypton and xenon to produce low intensity beams and that the process of ion resonance transfer is well established using these atomic gases and their associated ion beams. However, high intensity beams (greater than 1 milliampere?) have not previously been produced. Clearly, for most other atoms, more research is needed. While more research is needed to determine ionization potentials for both atoms and molecules it will be clear to those skilled in the art that there already exist a large number of molecular and atomic ion species which can be generated reliably and at intensities that might be considered useful as 'primary beams'.

BRIEF DESCRIPTION OF THE DRAWINGS

For better understanding of the present invention, reference is made to the accompanying drawings which are incorporated herein by reference.

DETAILED DESCRIPTION

Figure 1:
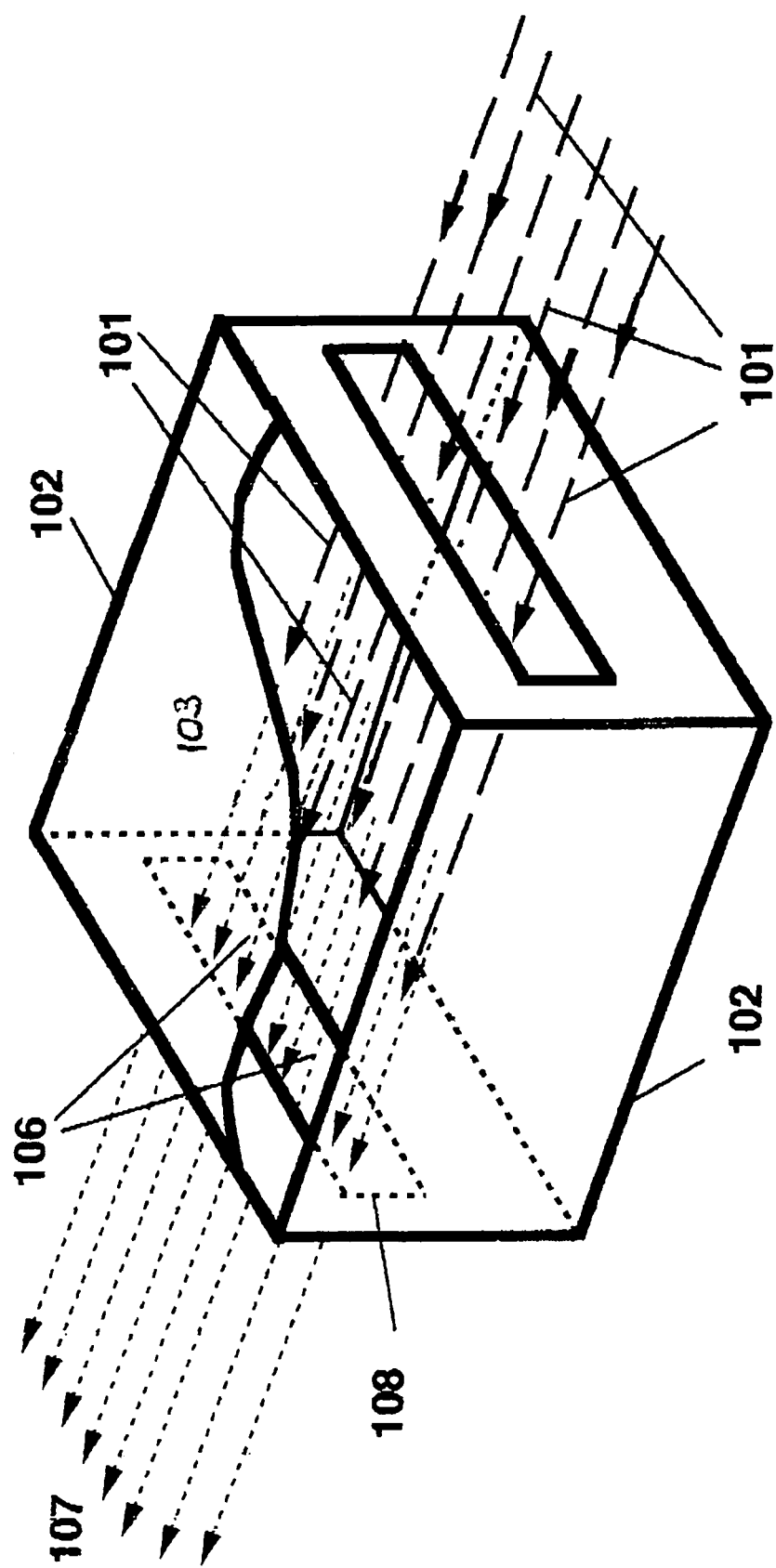
FIG. 1 illustrates operational details of a geometry where the wanted extracted beam is directed along the direction of the incident primary ion beam.

Referring to the drawings, and first to FIG. 1 thereof, therein is shown a primary ion beam, 101, entering a cell, 102, and passing through a gas or vapor, 103, contained within the cell. Either negative or positive ions can be used as the primary ion beam, 101, which can be either atomic or molecular. Within the cell, 102, the sample, 103, is maintained in a gaseous or vapor form at an appropriate vapor pressure. If necessary, temperature control may be needed using suitable heaters or refrigerators. The primary ion beam species, 101, is chosen so that the electron affinity or ionization potential of the ion species, 101, is approximately equal to the electron affinity or ionization potential of the atom or molecule comprising the gas or vapor, 103, that is to be converted to negative or positive ions. The resulting ions, 106, are extracted longitudinally from the opposite side of the cell from that where the primary ion beam enters and is formed into a suitable ion beam, 107, using extraction optics, the design and operation of which are well known to those skilled in the art.

In the case of decaborane ionization using As+ as the primary beam the cross sections are anticipated to be approximately $3.5 \times 10^{-15}$ cm$^2$. If the integrated thickness of the decaborane is adjusted to be $\sim 10^{15}$/cm$^2$, there will be about three resonant charge exchange collisions of As+ ions with decaborane molecules as the arsenic ions pass through the cell. Extraction of the decaborane ions formed within the source box is achieved by an electric field that penetrates into the source box through the extraction slot, 108. Extraction can also be enhanced by the introduction of a small electric field within the source box or by using ion motion induced by crossed electric and magnetic fields to produce ExB drifts, well known to those skilled in the art.

Figure 2:
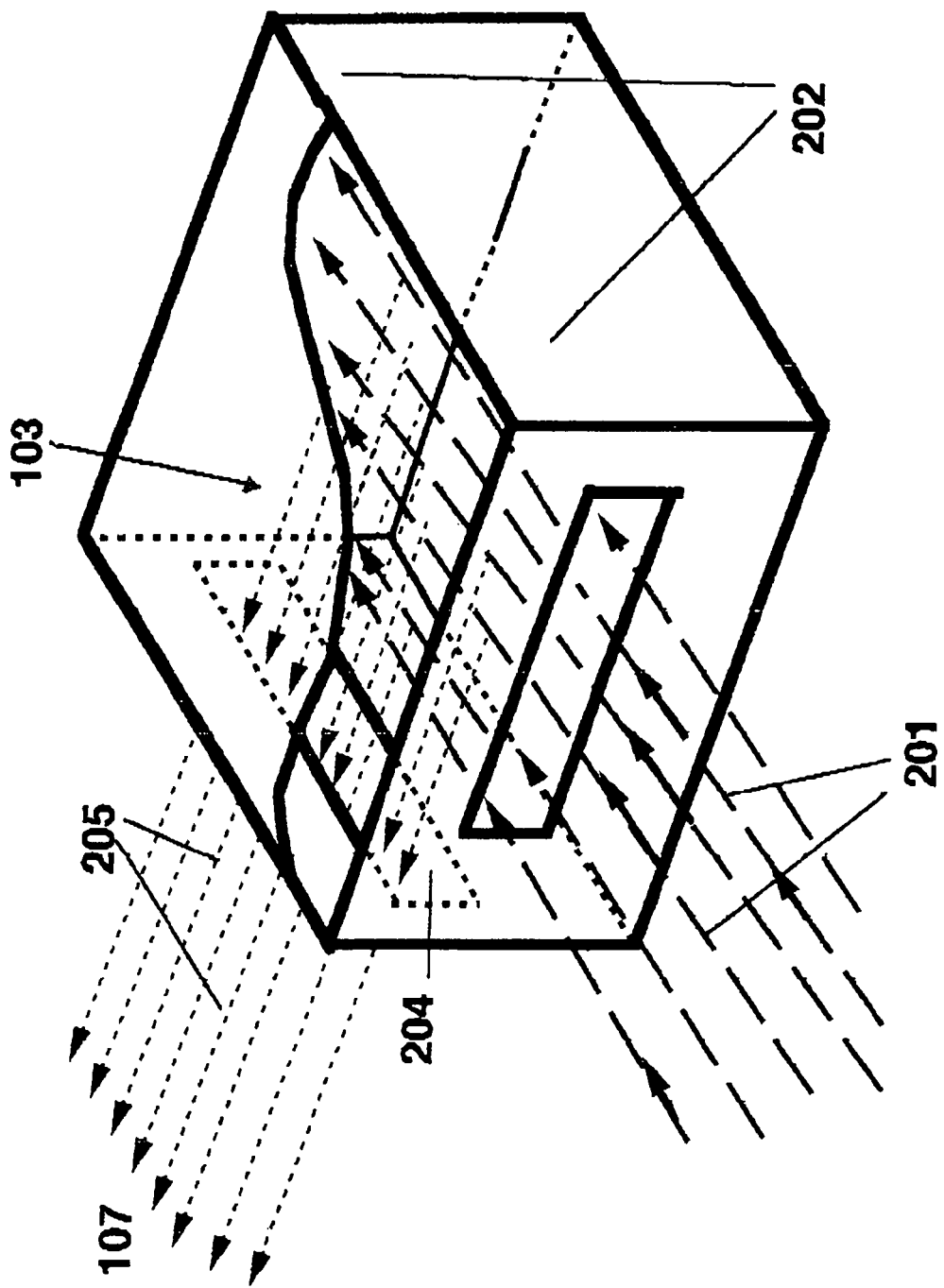
FIG. 2 illustrates the operational details of an extraction geometry where the emission direction of the extracted ions is a right angle to the direction of the incident primary ion beam.

As shown in FIG. 2, in some instances it will be more convenient to extract the wanted ions at right angles to the direction of incidence of the primary ion beam, 201. The vapor or gas sample in the center of the cell, 202, which is elevated to a positive potential, is bombarded by the incoming primary particle beam. Ions that are produced within the gas move away from the incoming primary ion beam by a suitable electric field that directs the wanted charged ions to the region of the extraction optics. A graded extraction field of a few volts/cm extending along the width of the cell or a crossed ExB field arrangement should permit efficient extraction of the ions. When the ions reach the extraction aperture, 204, they are accelerated and formed into a directed ion beam. If necessary a suitable electric field can be introduced within the cell, 202, by a series of equipotential planes or from the fringes of the acceleration fields which percolate through the aperture, 204.

Alternatively, the apparatus of FIGS. 1 and 2 can be used to create neutral beams. For example, an ionized primary beam 101 enters the cell 102 and passes through gas or vapor 103 contained within the cell. Electrons from the gas or vapor are transferred to the primary ion beam 101, thereby converting the ionized beam into a neutral beam. The resulting neutral beam 106 which then exits the cell 102 through extraction slot 108. In one specific embodiment, a ionized beam of boron is used, in conjunction with a target molecule of anisole.

We claim:

1. A method for preferentially producing ions of a wanted species within an ensemble of target atoms or molecules that does not include the rare gas atoms of helium, neon, argon, krypton or xenon for use within a charged particle beam having a current in excess of 200 microamperes comprising traversing said ensemble with an incident beam having high velocity atomic or molecular positive or negative ions wherein said incident beam of ions have an ionization potential or electron affinity within about 500 meV of the ionization potential or electron affinity of the ions of said wanted species that are desired to be produced within said ensemble.

2. The method of claim 1 where ions of wanted species can have either positive or negative polarity.

3. The method of claim 1 further comprising providing an electric field throughout the volume of the said ensemble.

4. The methods of claim 1 comprising providing an ExB drift of said wanted species.

5. The method of claim 3 whereby said electric field is provided substantially along the direction of said incident beam of atomic or molecular ions.

6. The method of claim 3 whereby said electric field is provided substantially at right angles to the direction of said incident beam of atomic or molecular ions.

7. The method of claim 1 where said target molecules to be ionized comprise decaborane and said incident beam of ionized atoms comprises singly-charged arsenic atoms.

8. A method for preferentially producing ions of a wanted species within an ensemble of target atoms or molecules for use within a charged particle beam having a current in excess of 5 milliamperes comprising traversing said ensemble with an incident beam having high velocity atomic or molecular positive or negative ions wherein said incident beam of ions have an ionization potential or electron affinity within about 500 meV of the ionization potential of the ions of said wanted species that are desired to be produced within said ensemble.

9. The method of claim 8 where ions of wanted species can have either positive or negative polarity.

10. The method of claim 8 further comprising providing an electric field throughout the volume of the said ensemble.

11. The methods of claim 8 comprising providing an E×B drift of said wanted species.

12. The method of claim 10 whereby said electric field is provided substantially along the direction of said incident beam of atomic or molecular ions.

13. The method of claim 10 whereby said electric field is provided substantially at right angles to the direction of said incident beam of atomic or molecular ions.

14. An apparatus for producing directed beams of ionized atoms or molecules having currents in excess of 200 microamperes from a group of target atoms or molecules excluding the rare gas atoms of helium, neon, argon, krypton or xenon, comprising in combination:
a cell adapted to hold said group of target atoms or molecules;
a means for ionizing said target atoms or molecules by removing electrons from said target atoms or molecules located within said cell by directing through said cell a primary beam of ionized atoms or molecules wherein said primary beam of ions have an ionization potential within about 500 meV of the ionization potential of the ions that are desired to be produced within said cell and
a means for extracting said ionized atoms or molecules following said ionization of said target atoms or molecules and transforming said extracted ions and molecules into said ion beam.

15. The apparatus of claim 14 where said target molecules located within said cell comprise decaborane.

16. The apparatus of claim 14 wherein said primary beam comprises arsenic ions.

17. The apparatus of claim 14 wherein said atoms or molecules of said primary beam are not of the same species as said target atoms or molecules.

18. The apparatus of claim 14 wherein said cell is temperature controlled.

19. An apparatus for producing directed beams of ionized atoms or molecules having currents in excess of 5 milliamperes from a group of target atoms or molecules comprising in combination:
a cell adapted to hold said group of target atoms or molecules;
a means for ionizing said target atoms or molecules by removing electrons from said target atoms or molecules located within said cell by directing through said cell a primary beam of ionized atoms or molecules wherein said primary beam of ions have an ionization potential within about 500 meV of the ionization potential of the ions that are desired to be produced within said cell and
a means for extracting said ionized atoms or molecules following said ionization of said target atoms or molecules and transforming said extracted ions and molecules into said ion beam.

20. The apparatus of claim 19 where said target molecules located within said cell is selected from the group comprising helium, neon, argon, krypton and xenon.

21. The apparatus of claim 19 where said target molecules located within said cell comprise decaborane.

22. The apparatus of claim 19 wherein said primary beam comprises arsenic ions.

23. The apparatus of claim 19 wherein said atoms or molecules of said primary beam are not of the same species as said target atoms or molecules.

24. The apparatus of claim 19 wherein said cell is temperature controlled.

25. An apparatus for producing directed beams of negatively charged atoms or molecules having currents in excess of 200 microamperes, from a group of target atoms or molecules comprising in combination:
a cell adapted to hold said group of target atoms or molecules;
a means for adding electrons to said target atoms or molecules by adding electrons to said target atoms or molecules located within said cell by directing through said cell a primary beam of negatively charged atoms or molecules wherein said primary beam of negatively charged have an electron affinity within about 500 meV of the electron affinity of the ions that are desired to be produced within said cell and
a means for extracting said negative atoms or molecules following said addition of electrons to said target atoms or molecules and transforming said extracted negative atoms and molecules into said ion beam.

26. An apparatus for producing directed beams of neutral atoms or molecules having singly charge particle-equivalent currents in excess of 200 microamperes comprising in combination:
a cell adapted to hold said group of target atoms or molecules;
a means for neutralizing atoms or molecules in a charged particle beam by adding electrons from atoms or molecules located within said cell thereby creating said beam of neutral atoms or molecules by directing through said cell said charged particle beam of ionized atoms or molecules wherein said beam of ionized atoms or molecules has an ionization potential within about 500 meV of the ionization potential of the atoms or molecules within said cell of the same species as said atoms or molecules within said cell.

27. The apparatus of claim 26 wherein said charged particle beam comprises boron and the molecules located within said cell comprise anisole.

28. The apparatus of claim 26 wherein said atoms or molecules of said charge particle beam are not of the same species as said atoms or molecules located within said cell.

29. A method for preferentially producing directed beams of neutral atoms or molecules of a wanted species having singly charge particle-equivalent currents in excess of 200 microamperes utilizing an ensemble of target atoms or molecules comprising traversing said ensemble with an incident beam having high velocity atomic or molecular ions of said wanted species wherein said incident beam of ions has an ionization potential or electron affinity within about 500 milli-electron volts of the ionization potential of said target atoms or molecules.

30. The method of claim 29 wherein said charged particle beam comprises boron and said target molecules comprise anisole.

31. The method of claim 29 wherein said atoms or molecules of said charged particle beam are not of the same species as said target atoms or molecules.

* * * * *